(12) United States Patent
Fischer et al.

(10) Patent No.: US 7,267,344 B2
(45) Date of Patent: Sep. 11, 2007

(54) PISTON RING WITH A PVD COATING

(75) Inventors: Manfred Fischer, Leichlingen (DE); Frank Munchow, Wermelskirchen (DE)

(73) Assignee: Federal Mogul Burscheid GmbH, Burscheid (DE)

( * ) Notice: Subject to any disclaimer, the term of this patent is extended or adjusted under 35 U.S.C. 154(b) by 110 days.

(21) Appl. No.: 10/505,042

(22) PCT Filed: Feb. 1, 2003

(86) PCT No.: PCT/DE03/00287

§ 371 (c)(1), (2), (4) Date: May 2, 2005

(87) PCT Pub. No.: WO03/070999

PCT Pub. Date: Aug. 28, 2003

(65) Prior Publication Data

US 2005/0218603 A1 Oct. 6, 2005

(30) Foreign Application Priority Data

Feb. 20, 2002 (DE) ................................ 102 07 078

(51) Int. Cl.
*F16J 9/26* (2006.01)
(52) U.S. Cl. ........................ 277/443; 277/442; 277/444

(58) Field of Classification Search ......... 277/442–444
See application file for complete search history.

(56) References Cited

U.S. PATENT DOCUMENTS

| 5,601,293 A * | 2/1997 | Fukutome et al. .......... 277/443 |
| 5,960,762 A | 10/1999 | Imai |
| 6,013,380 A * | 1/2000 | Harayama et al. .......... 428/627 |
| 6,054,225 A * | 4/2000 | Harayama et al. .......... 428/667 |
| 6,060,182 A * | 5/2000 | Tanaka et al. ............... 428/698 |
| 6,833,165 B2 * | 12/2004 | Smith et al. ................. 427/451 |
| 2002/0164098 A1 * | 11/2002 | Takayanagi et al. ........ 384/294 |

FOREIGN PATENT DOCUMENTS

| DE | 41 12 422 A1 | 10/1991 |
| DE | 44 41 136 A1 | 7/1995 |
| DE | 199 40 022 A1 | 3/2000 |
| DE | 694 21 614 T2 | 12/2000 |
| DE | 100 11 918 A1 | 9/2001 |
| JP | 64-6514 | * 1/1989 |
| JP | 10-103519 | * 4/1998 |

* cited by examiner

*Primary Examiner*—Alison K Pickard
(74) *Attorney, Agent, or Firm*—Robert L. Stearns; Dickinson Wright PLLC

(57) ABSTRACT

A piston ring for an internal combustion engine is made of steel and has an outer contact surface that is nitrated and coated to no more than 70 μm with a protective coating comprising nitrides of aluminum and/or silicium and/or zirconium in a matrix of chromium-nitride based material.

4 Claims, 1 Drawing Sheet

PISTON RING WITH A PVD COATING

Figure 1:
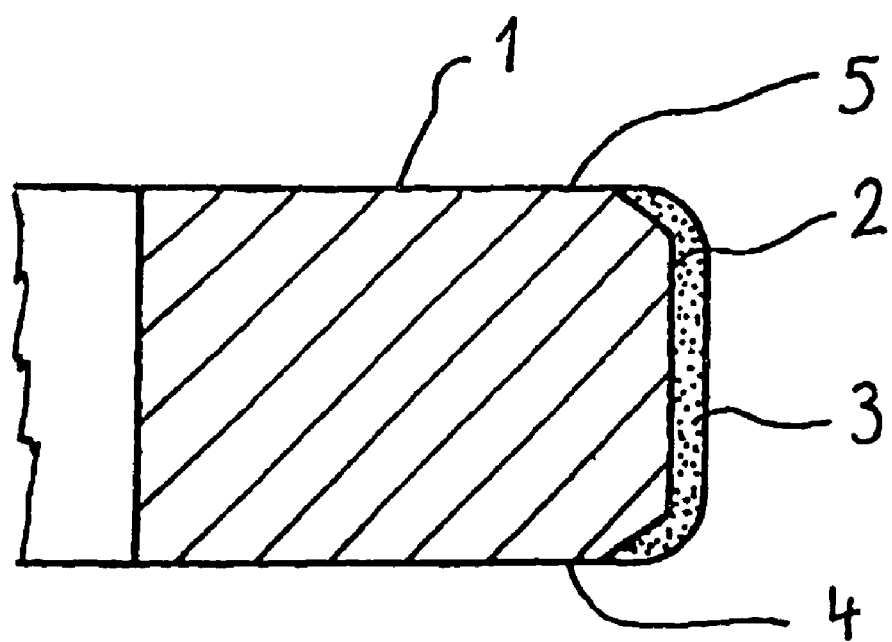

Piston ring for an internal combustion engine made of an alkaline steel material with a protective coating applied after the PVD-procedure at least in the area of the contact surface, and which is composed mainly of chromium nitride.

To meet the requirements of new motor development, it is compellingly necessary that the system components worn out from frictional wear and tear, the piston, piston ring and cylinder liner, are optimally synchronized. The piston ring has a special importance here. Contact surfaces of the piston ring are covered with a protective layer to attain the demanded part durability. Ever higher compression, direct injection, exhaust gas recirculation, reduction in oil use, and other traits of engineering encumber the piston rings in such a way that the expected part life can no longer be guaranteed with the usual piston ring coatings.

To extend part life, it is general practice to coat the contact surfaces of the piston rings with a layer to protect against abrasion. Plasma coating, nitration, galvanizing techniques or thin-film techniques such as CVD or PVD are well-known procedures from which these protective coatings are derived. Examples of the latter procedure are steam precipitation techniques, cathode-ray pulverization or vacuum steaming, as well as ion cladding.

An internal combustion engine piston ring with a protective coating applied using a PVD or CVD technique, at least in the area of the contact surfaces, is described in DE 100 11 918 A1.

The protective coating is characterized mainly as being composed of the elements chromium, carbon, and hydrogen and having a layer measuring at most 100 μm. The layer can, however, contain other metallic elements such as titanium, niobium, tungsten, and tantalum and as well as non-metallic elements such as oxygen and fixed nitrogen.

Layers yielded from these procedures have good strength property and firing trace characteristics. It has been shown that protective coatings such as these can only be applied in limited thicknesses, and thus, the demanded abrasion ratings cannot attain the demanded durability. As such, these coatings cannot be used in newer motors.

To augment the durability against resistance, a piston ring of U.S. Pat. No. 5,960,762 is proposed in the U.S. On its contact surface, this piston ring has a protective coating derived from a PVD technique. The protective surface may consist mainly of chromium nitride and/or titanium nitride.

A protective coating derived from this process certainly has high strength and firing trace characteristics, but the abrasion resistance is not sufficiently high enough. As these layers can only be applied in limited thicknesses, durability demands are not met, and thus, these coatings cannot be optimally applied, especially in higher capacity engines.

Evidence that the elements aluminum, silicon, or zirconium can be applied as nitride-forming substances cannot be gathered from this paper.

The task of overcoming the technical disadvantages of the current engineering situation is the basis for the patent: to provide a piston ring with a protective coating that improves the functional behavior, i.e., firing trace characteristics and its own characteristic resistance to abrasion, and that through this, the durability expectations of the piston ring are lengthened significantly.

The task is thus solved by embedding nitrides made from the elements aluminum and/or silicon and/or zirconium and whose layer thickness measures 70 μm at most (especially 5-50 μm) into the protective coating.

Promising elaborations on the piston ring conforming to the patent are documented in the claims below.

The patent renders it possible to produce a piston ring with a protective coating that distinguishes the ring by its high own resistance performance and by good resistance characteristics. The patented layer has a high inner strength and can be applied, when prepared appropriately, with exceptional adhesive strength to an alkaline piston ring material such as steel and cast iron. Moreover, it has a high firing trace safety and does not corrode the opposing element, namely the cylinder liner. The protective coating is resistant to corrosion in comparison to the substances appearing in the combustion area and has a high thermal conductivity to conduct the heat transmission from the ignition chamber over the pistons and piston rings to the cylinder liner surfaces.

From an engineering point of view, the well-known chromium nitride layers that can be broken down through a PVD-process and which can be produced both with and without any additional oxygen and carbon certainly exhibit a high firing trace safety and characteristic abrasion resistance, but they are insufficient to guarantee the demanded durability of a piston ring using a feasible layer thickness. Through the embedding of further nitride-forming elements such as aluminum, silicon, or zirconium subject to a patent, the own abrasion resistance of the coating improves without affecting the resistance of the opposing element negatively.

Along with the inclusion of an additional element in the chromium nitride layer, it is, pursuant to the patent, also conceivable to integrate a combination of more of the listed elements into the layer. Fundamentally, each combination of these elements is conceivable. A chromium-aluminum-silicium-nitride layer, a chromium-aluminum-silicium-zirconium-nitride layer, a chromium-aluminum-zirconium-nitride layer, or any other combination of these elements is possible. However, one must watch that the ratio of elements in the coating is neither less than ten atom percent nor greater than 50 atom percent. Here, the total metal content of the coating should be between 50 and 70 atom percent.

In a first model of the physical form, it is suggested in a patent to add aluminum to the chromium nitride layer. Here, the elemental composition of the protective coating is 20-60 atom percent chromium, 10-50 atom percent aluminum, and 30-50 atom percent liquid nitrogen. The metal content of the coating should be no less than 50 atom percent and no greater than 70 atom percent.

In a second model of the physical form, it is proposed in a patent to add silicium to a chromium nitride coating. Here, the element content of the protective coating is 20-60 atom percent chromium, 10-50 atom percent silicium, and 30-50 atom percent liquid nitrogen. Here, the chromium and silicium content of the coating should not measure less than 45 atom percent and not more than 70 atom percent.

In a third model of the physical form, it is suggested in a patent to add aluminum to a chromium nitride coating. Here, the element content of the protective coating measures 20-60 atom percent chromium, 10-50 atom percent zirconium, and 30-50 atom percent liquid nitrogen. The coating's metal content should not measure less than 50 atom percent and not more than 70 atom percent.

In a fourth model of the physical form, it is suggested in a patent to make a steel piston ring and then to treat it with a nitride technique before applying the protective coating. The piston ring is first nitrated according to normal procedure, at least on the contact surface; then, the protective coating subject to patent is applied by a PVD process.

The object to be patented is presented using a procedural model in a drawing, and is described as the following. The model has:

FIG. 1 Compression piston ring with a coating on its contact surfaces

FIG. 1 shows compression piston ring 1 made from an alkaline steel alloy. In the area of its contact surfaces 2, the ring is coated with a protective layer 3. The protective coating 3 is in this example arranged solely on the contact surface 2; it can, however, extend to parts of sides 4 and 5. Coating 3 is composed predominantly of chromium nitride. Here, nitrides from at least one of the elements Al, Si, or Zr chromium are embedded in the chromium nitride layer.

The invention claimed is:

1. A piston ring having an outer contact surface and a coating applied to said outer contact surface to a thickness no greater than 70 μm, said coating comprising a matrix of chromium-nitride based material and nitrides embedded in said matrix from at least one of the elements of aluminum, silicium and zirconium, and wherein said coating includes, by atomic percent, 20-60% chromium, 10-50% aluminum and 30-50% liquid nitrogen, and where the elements of chromium and aluminum in the coating is between 50 to 70% of the total elements.

2. A piston ring having an outer contact surface and a coating applied to said outer contact surface to a thickness no greater than 70 μm, said coating comprising a matrix of chromium-nitride based material and nitrides embedded in said matrix from at least one of the elements of aluminum, silicium and zirconium, and wherein said coating includes, by atomic percent, 20-60% chromium, 10-50% silicium and 35-55% liquid nitrogen, and where the elements of chromium and silicium in the coating is between 45 to 70% of the total elements.

3. A piston ring having an outer contact surface and a coating applied to said outer contact surface to a thickness no greater than 70 μm, said coating comprising a matrix of chromium-nitride based material and nitrides embedded in said matrix from at least one of the elements of aluminum, silicium and zirconium, and wherein said coating includes, by atomic percent, 20-60% chromium, 10-15% zirconium and 30-50% liquid nitrogen, and where the elements of chromium and zirconium in the coating is between 50-70% of the total elements.

4. A piston ring having an outer contact surface and a coating applied to said outer contact surface to a thickness no greater than 70 μm, said coating comprising a matrix of chromium-nitride based material and nitrides embedded in said matrix from at least one of the elements of aluminum, silicium and zirconium, and wherein said nitrides are formed from a combination of at least two of the elements of aluminum, silicium and zirconium, and where the total ratio of elements in the coating is between 10 to 50 atomic percent and the total metal content of the coating is between 50 to 70 atomic percent.

* * * * *

UNITED STATES PATENT AND TRADEMARK OFFICE
CERTIFICATE OF CORRECTION

PATENT NO. : 7,267,344 B2  Page 1 of 1
APPLICATION NO. : 10/505042
DATED : September 11, 2007
INVENTOR(S) : Manfred Fischer and Frank Munchow It is certified that error appears in the above-identified patent and that said Letters Patent is hereby corrected as shown below:

Each occurrence of the term "silicium" should be changed to -- silicon --, including:
In the Abstract,
Column 1, lines 54 and 65.
Column 2, lines 25, 32, 33, 48, 50 and 52.
Column 3, line 20.
Column 4, lines 1, 2, 4, 11, 21, and 23.

The term "liquid" should be canceled in:
Column 2, lines 44, 51, and 58.
Column 3, line 22.
Column 4, lines 3, and 13.

Signed and Sealed this

Nineteenth Day of August, 2008

JON W. DUDAS
*Director of the United States Patent and Trademark Office*